United States Patent
Akahori et al.

(12) 
(10) Patent No.: US 6,320,154 B1
(45) Date of Patent: Nov. 20, 2001

(54) PLASMA PROCESSING METHOD

(75) Inventors: Takashi Akahori, Hachioji; Risa Nakase; Shinsuke Oka, both of Sagamihara, all of (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 09/101,504

(22) PCT Filed: Nov. 14, 1997

(86) PCT No.: PCT/JP97/04151

§ 371 Date: Apr. 27, 1999

§ 102(e) Date: Apr. 27, 1999

(87) PCT Pub. No.: WO98/21746

PCT Pub. Date: May 22, 1998

(30) Foreign Application Priority Data

Nov. 14, 1996 (JP) .................................................. 8-320915

(51) Int. Cl.[7] .................................................. B23K 10/00
(52) U.S. Cl. .................................. 219/121.41; 118/723 I; 438/715
(58) Field of Search .................. 219/121.41, 121.43, 219/121.2; 315/111.21; 438/710, 719, 715; 134/1.1; 361/234; 427/569, 573; 204/298.17; 118/723 VE, 724, 50.1

(56) References Cited

U.S. PATENT DOCUMENTS

| 4,911,814 | * | 3/1990 | Matsuoka et al. | 204/298.17 |
| 4,975,146 | * | 12/1990 | Knapp et al. | 134/1.1 |
| 5,332,441 | * | 7/1994 | Barnes et al. | 118/723 I |
| 5,433,258 |  | 7/1995 | Barnes et al. . |  |
| 5,456,796 | * | 10/1995 | Gupta et al. | 438/710 |

(List continued on next page.)

FOREIGN PATENT DOCUMENTS

| 0 628 985 | 12/1994 | (EP) . |
| 61-218134 | 9/1986 | (JP) . |
| 62-43335 | 12/1987 | (JP) . |
| 63-233549 | 9/1988 | (JP) . |
| 64-32631 | 2/1989 | (JP) . |

(List continued on next page.)

OTHER PUBLICATIONS

H. Kudo, et al., "Characteristics of Plasma–CF films for Very Low–k Dielectrics".

S. Takeishi, et al., "Fluorocarbon Films Deposited by PECVD with High Thermal Resistance and Low Dielectric Constants".

W. Lee, et al., "Plasma Polymerization of Low Dielectric Constant Fluorocarbon Polymer by ECR".

(List continued on next page.)

*Primary Examiner*—John A. Jeffery
*Assistant Examiner*—Quang Van
(74) *Attorney, Agent, or Firm*—Smith Gambrell & Russell, LLP (57) ABSTRACT

An objective of this invention is to provide a plasma processing method that is capable of reducing particle contamination during plasma processing performed upon a semiconductor wafer. If the use of electron cyclotron resonance to generate a plasma and form a thin film of SiOF or the like is used by way of example, a sheath zone of a few mm thick is formed between the wafer and the plasma, and particles are trapped within a boundary zone between the sheath zone and the plasma. At this point, a microwave power is not dropped suddenly to zero after the film-formation processing, but is reduced to a lower level of, for example, 1 kW and is held for 10 seconds. This reduces the plasma density and thickens the sheath zone, so that particles are held away from the wafer surface. When the microwave power is subsequently cut, the particles move freely around, but only a small proportion thereof adhere to the wafer.

5 Claims, 9 Drawing Sheets

U.S. PATENT DOCUMENTS

| | | | |
|---|---|---|---|
| 5,547,539 | * 8/1996 | Arasawa et al. | 438/715 |
| 5,639,341 | * 6/1997 | Tabara | 438/710 |
| 5,646,814 | * 7/1997 | Shamouilian et al. | 361/234 |
| 5,756,400 | * 5/1998 | Ye et al. | 438/710 |
| 5,874,362 | * 2/1999 | Wong et al. | 438/719 |
| 5,882,423 | * 3/1999 | Linn et al. | 134/1.1 |
| 5,914,568 | * 6/1999 | Nonaka | 315/111.21 |

FOREIGN PATENT DOCUMENTS

| | | |
|---|---|---|
| 3-3380 | 1/1991 | (JP) . |
| 4-271122 | 9/1992 | (JP) . |
| 5-29285 | 2/1993 | (JP) . |
| 5-291194 | 11/1993 | (JP) . |
| 6-151362 | 5/1994 | (JP) . |
| 6-196421 | 7/1994 | (JP) . |
| 6-283484 | 10/1994 | (JP) . |
| 07086242 | 3/1995 | (JP) . |
| 07115085 | 5/1995 | (JP) . |
| 8-176854 | 7/1996 | (JP) . |

OTHER PUBLICATIONS

K. Endo, et al., "Effect of Bias Addition on the Gap–Filling Properties of Fluorinated Amorphous Carbon Thin Films Grown by Helicon Wave Plasma Enhanced Chemical Vapor Deposition".

"Regimes of Particle Trapping in Inductively Coupled Plasma Processing Reactors" by Hwang H. H. Et al. dated Jun. 24, 1996; pp. 3716–3718.

Masaharu Shirantani et al., In Situ Observation of Particle Behavior in rf Silan Plasmas, Japanese Journal Applied Physics, pp. 1887–1893, Aug. 1991.

* cited by examiner

PLASMA PROCESSING METHOD

FIELD OF THE INVENTION

The present invention relates to a plasma processing method for performing a plasma process upon an object to be processed, such as a semiconductor wafer.

BACKGROUND OF THE INVENTION

During the fabrication of a semiconductor device, a plasma is often used to subject a semiconductor wafer (hereinafter called a wafer) to a process such as film-formation or etching. This processing is performed by introducing a processing gas into a vacuum vessel which is provided with a mounting stand for a wafer, then supplying energy such as electromagnetic energy to that processing gas to create a plasma therefrom. Various methods are known as methods of supplying this electromagnetic energy, such as electron cyclotron resonance (ECR), which makes use of the interaction between microwaves and a magnetic field, and a method known as inductive coupled plasma (ICP) in which an electric field and a magnetic field from a coil surrounding a dome-shaped vessel are applied to a processing gas.

A high-density plasma is established in a zone corresponding to the wafer, but a thin plasma is also present throughout the entire interior of the vacuum vessel. This deteriorates an O-ring that acts as a sealing material and also causes peeling of a film that has adhered to the walls of the vessel due the reactions of the processing gas. It is therefore not possible to avoid the generation of particles within the vacuum vessel. Particularly with plasma processing, the speed of movement of electrons within the plasma is greater than that of ions, so a large number of electrons adhere to surfaces such as the walls and internal members of the vessel, as well as the wafer, and are negatively charged. Thus the potential gradient in the vicinity of these surfaces destroys the neutral characteristics of the plasma in the vicinity of the surfaces, without allowing the electrons to approach, thus forming a zone called a sheath of a thickness of a few mm.

Since the particles are negatively charged, they cannot pass through the sheath zone and are pushed back towards the plasma. As seen from a certain point in time, it occurs that these particles appear to be trapped at the boundary between the plasma and the sheath zone. However, when the microwave power and wafer biasing power are cut, the particles trapped at positions floating above the wafer will tend to adhere to the wafer. There is therefore a demand for a method of suppressing the generation of these particles as far as possible, especially since circuitry patterns will continue to become finer in the future.

The present invention was devised in the light of the above problems with the conventional art and has as an objective thereof the provision of a plasma processing method that is capable of suppressing the creation of particles, thus increasing the yield.

SUMMARY OF THE INVENTION

In order to achieve the above described objective, an aspect of the present invention disclosed in a first claim herein relates to a plasma processing method comprising the steps of:

supplying at least electrical power to a processing gas within a processing chamber to form a plasma, and using that plasma to perform a plasma process on an object to be processed;

subsequently forming a plasma that does not promote processing at an electrical power that is lower than that used during the previous step, instead of the plasma of the processing gas, to form a sheath zone above the object to be processed that is thicker than a sheath zone thereabove during the previous step; and conveying the object to be processed out of the processing chamber.

In another aspect of this invention disclosed in a second claim herein, the plasma processing method comprising the steps of placing an object to be processed on a mounting stand that is provided within a processing chamber and includes an electrode, supplying at least electrical power to a processing gas to form a plasma, applying biasing power to the electrode, and using that plasma to perform a plasma process on the object to be processed while ions within the plasma are drawn towards the object to be processed;

subsequently forming a plasma that does not promote processing instead of the plasma of the processing gas, and increasing the biasing power to higher than that used during the previous step, to form a sheath zone above the object to be processed that is thicker than a sheath zone thereabove during the previous step; and conveying the object to be processed out of the processing chamber.

In a further aspect of this invention disclosed in a third claim herein, the plasma processing method comprising the steps of:

forming a magnetic field by a magnetic field formation means in such a manner that magnetic lines of force thereof run from a zone corresponding to a surface to be processed of an object to be processed towards the object to be processed, and also forming a plasma from a processing gas that is supplied into a processing chamber, based on the interaction between an electrical field and the magnetic field, and using that plasma to perform a plasma process on the object to be processed;

subsequently forming a plasma that does not promote processing instead of the plasma of the processing gas, and adjusting the magnetic field in such a manner that the magnetic lines of force thereof in the vicinity of the object to be processed fan out further than during the previous step; and conveying the object to be processed out of the processing chamber.

A still further aspect of this invention disclosed in a fourth claim herein relates to the method of the third claim, wherein: the magnetic field formation means is disposed so as to surround a central axis of the object to be processed and comprises a first coil provided above the object to be processed and a second coil provided either beside or below the object to be processed; and the step of adjusting the magnetic field is done by either reducing a current flowing through the second coil to less than that during the plasma processing (including a reduction to zero) or reversing the current.

In a yet further aspect of this invention disclosed in a fifth claim herein, the plasma processing method comprising the steps of:

attracting an object to be processed by electrostatic attraction to a mounting stand that is provided within a processing chamber and includes an electrostatic chuck, and also supplying electrical power to a processing gas within a processing chamber to form a plasma, then using the plasma to perform a plasma process on the object to be processed;

subsequently separating the object to be processed from the mounting stand and applying a negative voltage to a chuck electrode of the electrostatic chuck; and placing another object to be processed on the mounting stand and performing plasma processing thereon.

In an even further aspect of this invention disclosed in a sixth claim herein, the plasma processing method comprises: a step of supplying a processing gas into a processing chamber and forming a film on an object to be processed;

performing a first cleaning step for cleaning the interior of the processing chamber with a plasma of a halogenized gas; and performing a second cleaning step for cleaning the interior of the processing chamber with a plasma including at least an oxygen plasma.

In a final aspect of this invention disclosed in a seventh claim herein, the plasma processing method comprising the steps of:

forming a magnetic field by a magnetic field formation means in such a manner that magnetic lines of force thereof run from a zone corresponding to a surface to be processed of an object to be processed towards the object to be processed, and also forming a plasma from a processing gas that is supplied into a processing chamber, based on the interaction between an electrical field and the magnetic field, and using the plasma to form a film on the object to be processed; and performing a cleaning step for cleaning the interior of the processing chamber with a plasma of a cleaning gas;

wherein the magnetic field is adjusted during the cleaning step in such a manner that the magnetic lines of force thereof in the vicinity of the object to be processed fan out further than during the previous step.

BRIEF DESCRIPTION OF THE DRAWINGS

FIG. 4A shows a state of particles when a conventional-art method is used, whereas

DESCRIPTION OF PREFERRED EMBODIMENT

The description below relates to an embodiment of the present invention applied to plasma processing performed by using an electron cyclotron resonance (ECR) type of plasma processing apparatus. The structure of a plasma processing apparatus 1 will first be described with reference to FIG. 1. This plasma processing apparatus 1 has a vacuum vessel 2 made of a material such as aluminum. The vacuum vessel 2 consists of a cylindrical plasma chamber 21, which is positioned at the top of the vacuum vessel 2 and in which a plasma is generated, and a cylindrical film-formation chamber 22 of a larger diameter of that of the plasma chamber 21, which is positioned therebelow and communicating therewith. Note that the vacuum vessel 2 is grounded and is thus at zero potential.

Figure 1:
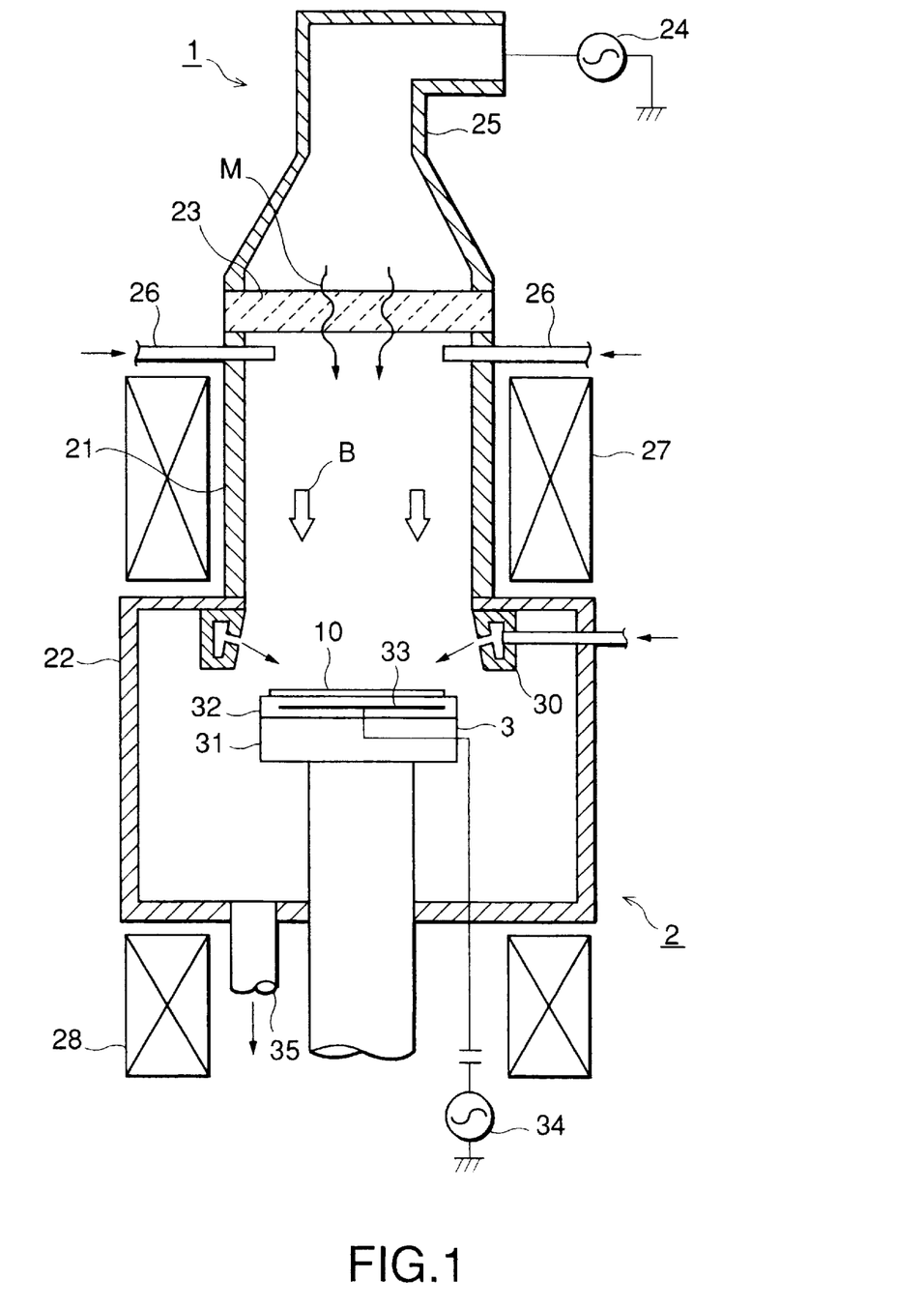
FIG. 1 is a vertical cross-sectional view of an example of a plasma processing apparatus for implementing the method of this invention.

An upper edge of this vacuum vessel 2 is open but is sealed hermetically with a transparent window 23 formed of a material that is transparent to microwaves, such as quartz, so as to maintain the vacuum state of the vacuum vessel 2. On the outer side of this transparent window 23 is provided a wave guide 25 connected to a high-frequency power source 24 which is a high-frequency supply means for generating a plasma at, for example, 2.45 GHz. The configuration is such that microwaves M generated in the high-frequency power source 24 are guided by the wave guide 25 and are introduced into the plasma chamber 21 through the transparent window 23.

Plasma gas nozzles 26 are provided in a side wall that defines the plasma chamber 21 at, for example, regular intervals around the periphery thereof. In addition, the configuration is such that a plasma gas source, such as a source of Ar or $O_2$, (not shown in the figure) is connected thereto so that a plasma gas such as Ar or $O_2$ is supplied to an upper portion within the plasma chamber 21 uniformly and without interruptions. Note that only two of the nozzles 26 are shown in the figure, to avoid over-complexity of the drawing, but in practice a larger number will be provided.

An annular main electromagnetic coil 27 is disposed about the outer periphery of the side wall that defines the plasma chamber 21 in close contact therewith, as a means for forming a magnetic field. In addition, an annular auxiliary electromagnetic coil 28 is disposed on a lower side of the film-formation chamber 22 in such a manner that a magnetic field B of, for example, 875 Gauss, is formed extending from the plasma chamber 21 above, downward towards the film-formation chamber 22. The ECR plasma conditions are satisfied thereby. Note that permanent magnets could be used instead of magnetic coils.

The above described ECR plasma is generated by the interaction caused by the formation of the microwaves M and the magnetic field B within the thus configured plasma chamber 21, where the frequency of the microwaves M is controlled. At this point, resonance is induced in the introduced gas at this frequency so that a plasma of a high density is formed. In other words, this apparatus is configured as an electron cyclotron resonance (ECR) plasma processing apparatus.

An annular film-formation gas supply portion 30 is provided in an upper portion of the film-formation chamber 22, in other words, in the portion thereof communicating with the plasma chamber 21, in such a manner that a film-formation gas is ejected from an inner peripheral surface thereof A mounting stand 3 is also provided in the film-formation chamber 22 in an elevatable manner. This mounting stand 3 is provided with an electrostatic chuck 32, which has an internal heater, on top of a main unit 31 of a material such as aluminum. A chuck electrode 33 within the electrostatic chuck 32 also acts as an electrode for applying a bias voltage in order to draw ions towards the wafer 10, and it is connected to a power supply such as a high-frequency power supply portion 34. An exhaust pipe 35 is connected to a base portion of the film-formation chamber 22.

The description now turns to the use of the above described apparatus in a method of forming an inter-layer insulating film on a wafer 10 that is the object to be processed. It is assumed in this case that aluminum wiring has been formed on the surface of this wafer 10 and the inter-layer insulating film is to be an SiOF film, by way of example. First of all, a gate valve provided in a side wall of the vacuum vessel 2, but not shown in the figure, is opened then the wafer 10 is conveyed thereinto by a conveyor arm (not shown in the figure) from a load-lock chamber (also not shown in the figure).

After the gate valve has been closed, sealing the interior of the apparatus, the internal atmosphere is exhausted from the exhaust pipe 35 to evacuate the apparatus to a predetermined degree of vacuum, then gases for generating a plasma, such as $O_2$ and Ar, are introduced into the plasma chamber 21 from the plasma gas nozzles 26 at flow rates of 200 sccm and 350 sccm, respectively. In addition, a film-formation gas such as $SiF_4$ is introduced into the film-formation chamber 22 from the film-formation gas supply portion 30 at a flow rate of 140 sccm. The interior of the vacuum vessel 2 is then maintained at a processing pressure of, for example, 0.4 Pa; biasing power at 13.56 MHz and 2500 W is applied to the wafer 10; and also the surface temperature of the mounting stand 3 is set to 200° C.

High-frequency power (microwaves) at 2.45 GHz from the high-frequency power source 24 for plasma generation is transmitted through the wave guide 25 towards the ceiling portion of the vacuum vessel 2, passes through the transparent window 23 provided therein, and is introduced into the plasma chamber 21 as the microwaves M. The magnetic field B generated by the electromagnetic coils 27 and 28, from above and directed downward, is applied within the plasma chamber 21 at a strength of, for example, 875 Gauss. The interaction between this magnetic field B and the microwaves M induces an electrical field E as well as the magnetic field B, which generates electron cyclotron resonance, and this resonance causes the Ar to become a plasma.

The plasma flowing from the plasma chamber 21 and into the film-formation chamber 22 activates the $SiF_4$ gas supplied thereto to form active seeds, and an SiOF film is formed by the reaction between $SiF_4$ and $O_2$ to fill concavities on the wafer 10. During this time, the Ar ions are drawn towards the wafer 10 by the bias voltage for attracting the plasma, and the corners of the SiOF film formed in the pattern (concavities) on the surface of the wafer 10 are shaved off by the sputter-etching action thereof, and thus the Ar ions fulfil the role of broadening the apertures in the pattern.

Figure 2:
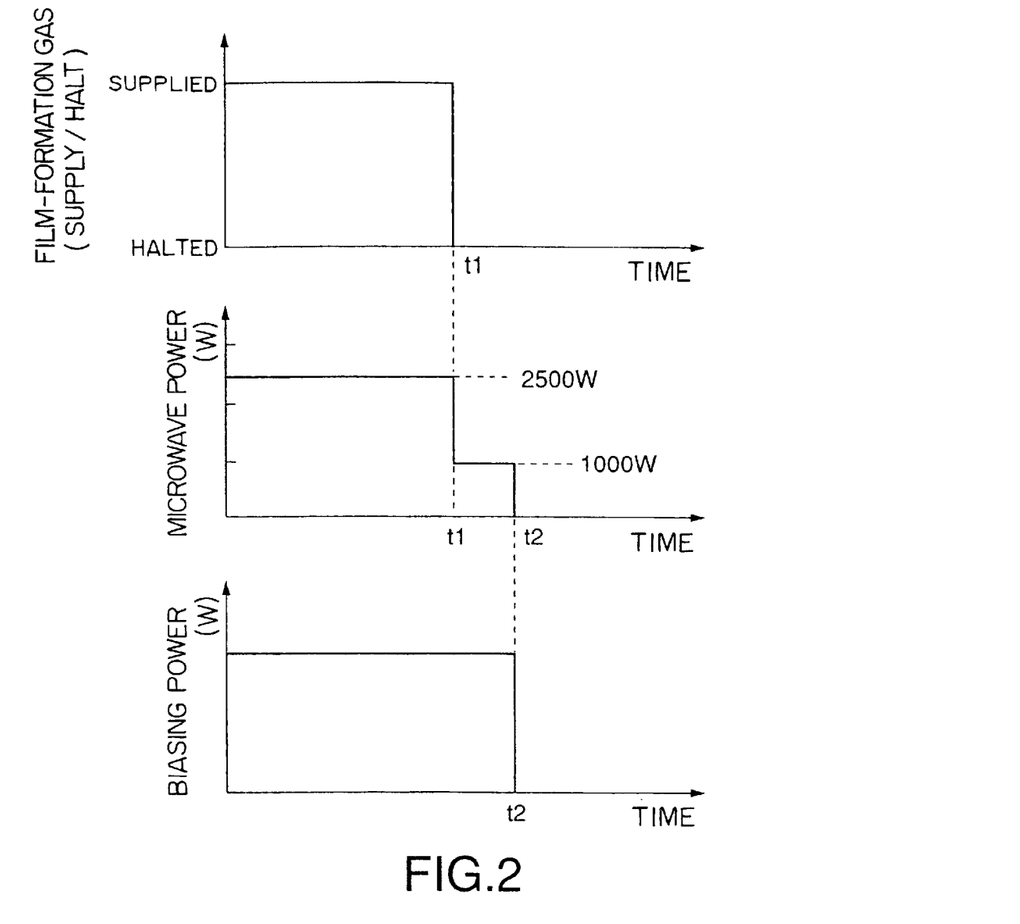
FIG. 2 illustrates an embodiment of the method of this invention.

This embodiment of the present invention affects the subsequent processing. In other words, at a time t1, immediately after the film formation is completed, the supply of the plasma gases Ar and $O_2$ continues without changes but the supply of film-formation gas is halted and also the microwave power is reduced from 2500 W to 1000 W, as shown in FIG. 2. A certain time later, such as 10 seconds later, the supply of the microwave power and the biasing power are stopped.

Figure 3:
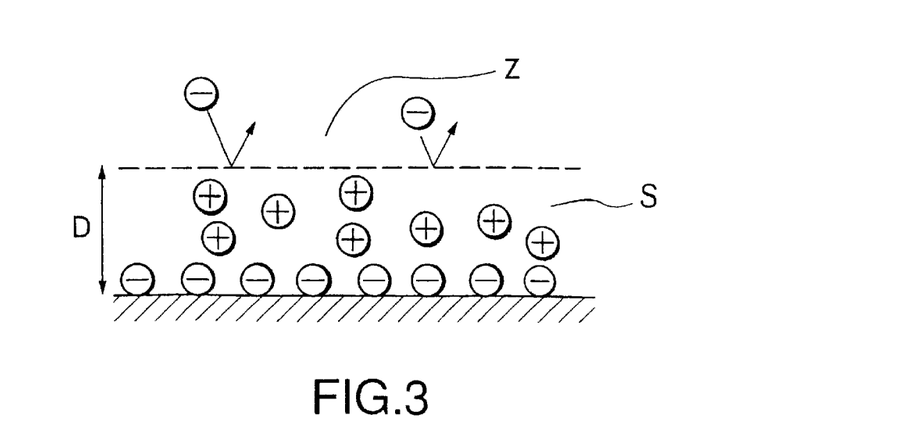
FIG. 3 illustrates a situation wherein a sheath zone is formed when a plasma is established.

This makes it possible to reduce the number of particles on the wafer. The reason for this can be considered to be as described below. In other words, as discussed in the section on the conventional-art technique, the speed of movement of the electrons within the plasma is greater than that of the ions, so large numbers of electrons adhere in the vicinity of the surfaces of the materials or the wafer, as shown in FIG. 3. Thus the neutral characteristics of the plasma in a plasma zone Z are destroyed to form a sheath zone S. The depth D of this sheath zone S increases with decreasing electron density. This is because the magnitude of the charge of electrons adhering to a material is determined, and thus the magnitude, of the positive charge inherent to the sheath zone S is also determined. Therefore, if the electron density is low (if the plasma density is low), the number of ions within the sheath zone S is small. With a small number of ions, the ion layer necessary for maintaining a certain charge becomes thicker and, as a result, the sheath zone S also becomes thicker.

Figure 4A:
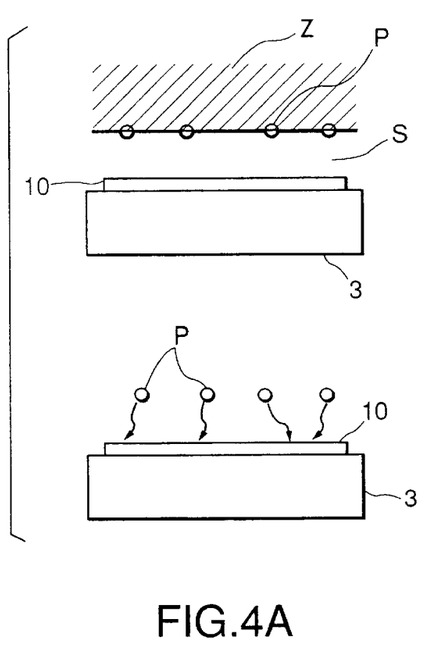
Figure 4B:
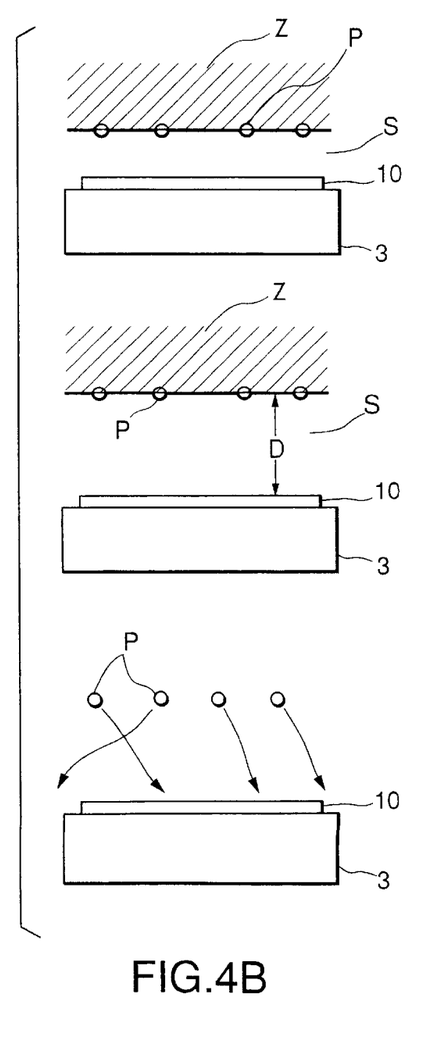
FIG. 4B shows the effect of the action of the embodiment of FIG. 2.

If, therefore, this sheath zone S is formed above the surface of the wafer 10 during the film formation, as shown in FIG. 4A, and the microwave power and biasing power are cut in that state, particles P will adhere to the wafer 10. Since the particles are extremely small at no more than 1 μm, they are moved around freely by external influences such as air current, rather than fall under gravity, so any particles that are in the vicinity of the wafer 10 will strike it and adhere thereto. In this case, if the microwave power is reduced after the film is formed, the electron density drops and as a result the thickness D of the sheath zone S becomes larger, as shown in FIG. 4B.

Since the particles P appear to be trapped between the sheath zone S and the plasma zone Z, increasing the thickness D of the sheath zone S ensures that the particles P are moved away from the surface of the wafer 10. If the microwave power and biasing power are both cut at this point, the number of particles adhering to the wafer 10 will be small.

Figure 5:
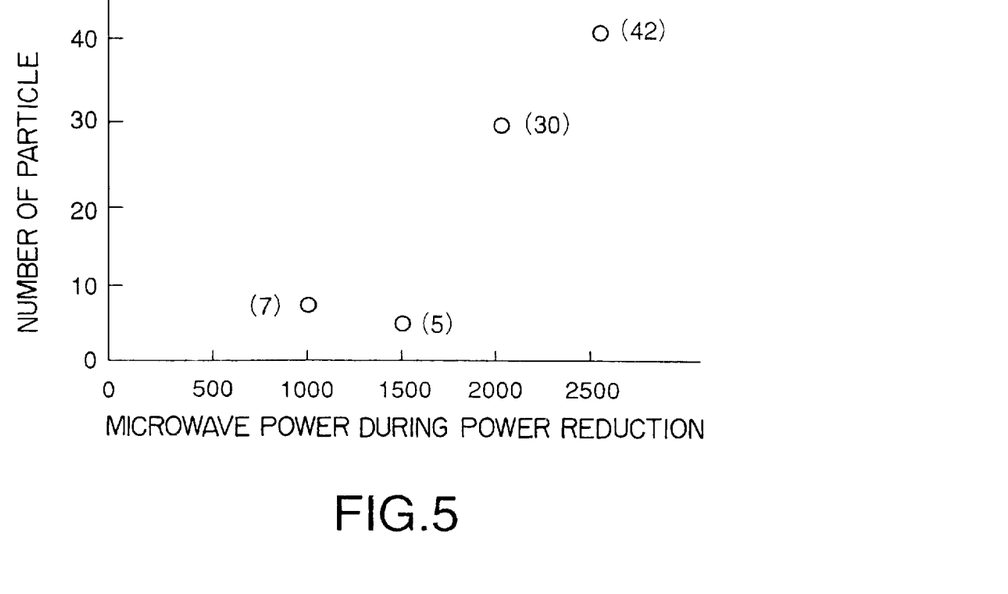
FIG. 5 is a graph of the relationship between microwave power applied after a film has been formed and the number of particles.

Experiments were performed with the microwave power set to 2500 W during the formation of the film. After a film had been formed on the surface of the wafer 10 under the previously described processing conditions, the microwave power was reduced in the sequence shown in FIG. 2, this microwave power was changed in various ways, and the numbers of particles between 0.25 μm and 1 μm out of those on each 8-inch wafer were counted, with the results being as shown in FIG. 5. If the period between the times t1 and t2 in FIG. 2 during which the microwave power is reduced is called "power reduction processing", the horizontal axis shows the microwave power during this power reduction. It is clear from these results that the number of particles on the wafer 10 is reduced by lowering the microwave power after the film is formed, and this will improve the yield. Note that "reducing the microwave power" also includes cases in which the microwave power is reduced gradually. This method is not limited to film-formation processing; it can also be applied to etching, in which case the supply of etching gas can be changed to Ar gas, and the microwave power reduced.

Another way of increasing the thickness of this sheath could be to increase the biasing power so that it is at a setting such as 3500 W during the power reduction period. This would also make it possible to reduce the number of particles. The reason why increasing the biasing power increases the thickness of the sheath is discussed below. If the biasing power increases, the bias voltage also increases, and moreover the frequency of that voltage is 13.56 MHz, which is high enough that the ions cannot follow. Therefore, the sheath thickness increases at the instant that a negative bias voltage is applied. Since the potential of the plasma is always higher than that of the outer walls, the sheath thickness does not become too small, even if a positive bias voltage is applied. Therefore, the average sheath thickness increases. It should be noted, however, that if the biasing power becomes too great, sputter-etching will occur on the surface of the wafer, so it is preferable to adjust the microwave power instead.

It should be noted that the method of the present invention is not limited to use in an ECR plasma processing apparatus; it can also be used in the above mentioned ICP apparatus, in which case the configuration could be such that the current of coil is reduced so that the electromagnetic energy drops after the film-formation processing, thus reducing the electron density.

Figure 6:
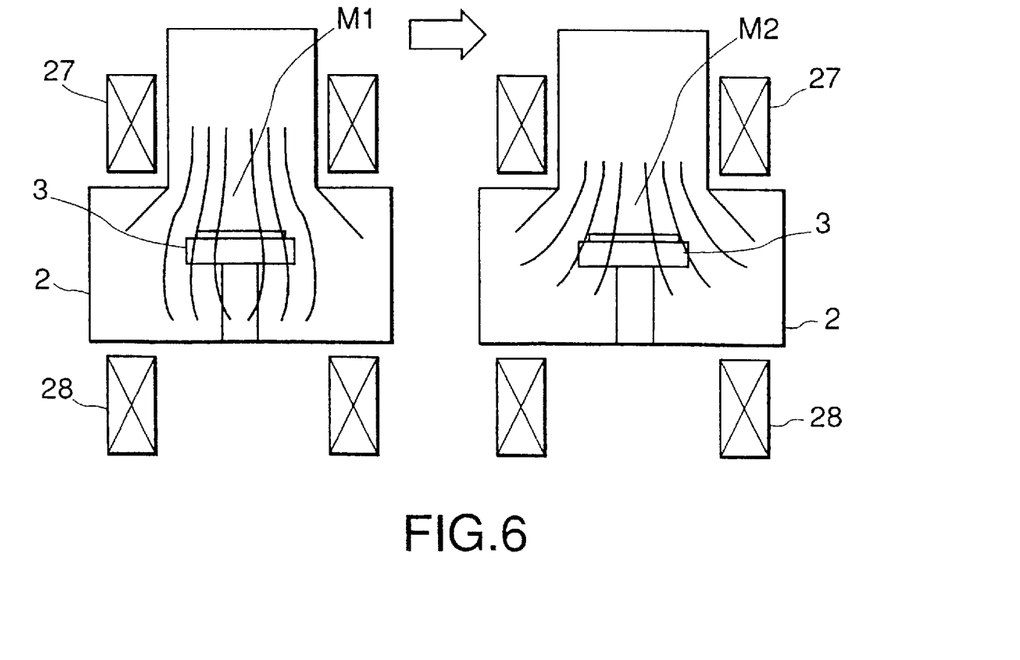
FIG. 6 illustrates a Miller magnetic field and a divergent magnetic field.
Figure 7:
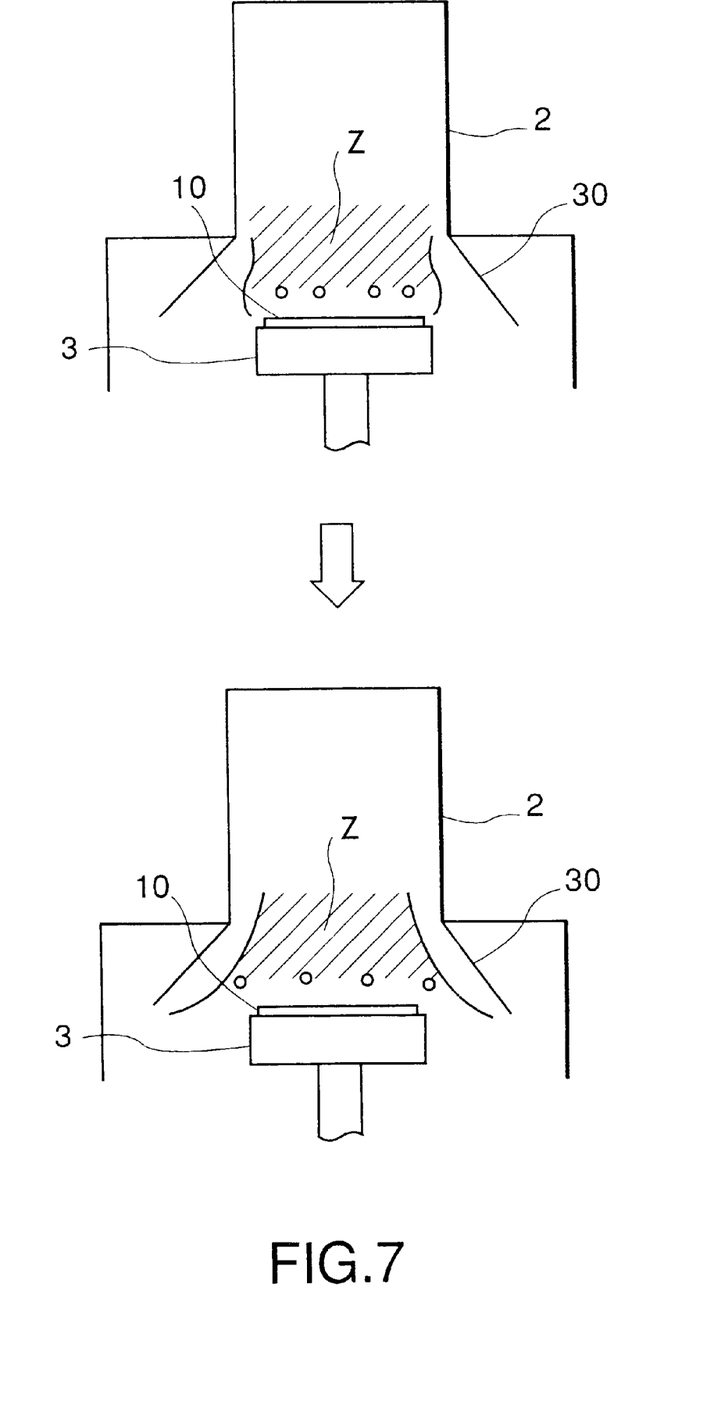
FIG. 7 illustrates another embodiment of the present invention.
Figure 8:
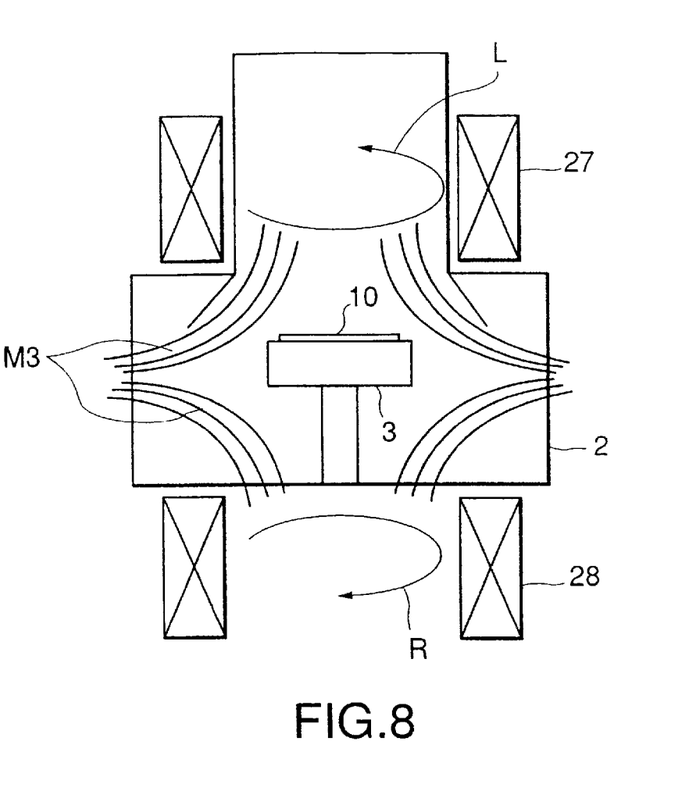
FIG. 8 illustrates an example of a method of forming a magnetic field.

The method described below is also effective for reducing the number of particles adhering to the wafer surface even further. Power is passed through the main electromagnetic coil 27 and the auxiliary electromagnetic coil 28 during the formation of the film, but when the film formation is completed the current in the auxiliary electromagnetic coil 28 is lowered or made to be zero so that the field changes from a Miller electromagnetic field M1 to a dispersed electromagnetic field M2, as shown in FIG. 6. Alternatively, the direction R of the current flowing through the auxiliary electromagnetic coil 28 could be made to be opposite to the direction L of the current flowing through the main electromagnetic coil 27 to form a cusped electromagnetic field M3, as shown in FIG. 8. In this power reduction process, the supply of film-formation gas stops but the supply of Ar and $O_2$ continues, in a similar manner to the previous embodiment. This causes the plasma zone to expand, as shown in FIG. 7, so that the groups of particles that were trapped as described previously are moved towards the sides, the number of particles corresponding to the wafer 10 is thereby reduced, and therefore the number of particles adhering to the wafer 10 is reduced. Note that the configuration could also be such that the direction of flow of current in the auxiliary electromagnetic coil 28 is reversed to form a cusped magnetic field, as shown in FIG. 8.

Figure 9:
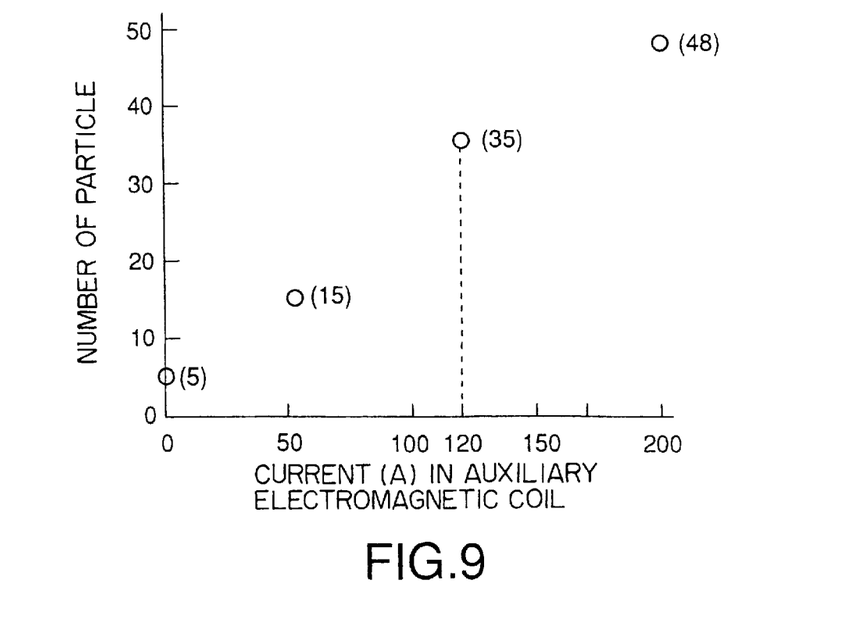
FIG. 9 is a graph of the relationship between the current passing through the auxiliary electromagnetic coil after the film has been formed and the number of particles.

After a film was formed on an 8-inch wafer as described above, power-reduction processing was performed in which the current in the auxiliary electromagnetic coil 28 was changed in various ways, and the numbers of particles between 0.25 μm and 1 μm on the wafer surface were counted, with the results being as shown in FIG. 9. It is clear from this graph that the number of particles decreases as the current in the auxiliary electromagnetic coil 28 decreases. Note that the current in the auxiliary electromagnetic coil 28 was 120 A during the film formation.

The present invention relates to a method for preventing particle contamination of wafers during plasma processing, but this method can also have other embodiments. One of these embodiments is intended to reduce the number of particles adhering to the surface of the mounting stand 3. If particles adhere to the surface of the mounting stand, those particles may transfer to the rear surface of the wafer so that, when the wafer is accommodated within a cassette, the particles may fall off and adhere to the surface of a wafer in a lower stage, which will deteriorate the yield.

Figure 10:
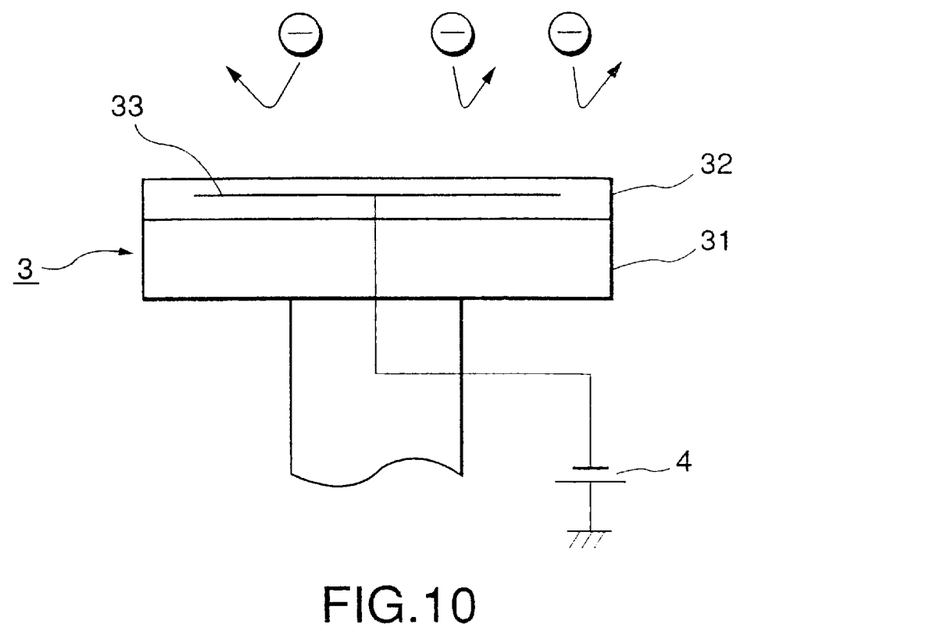
FIG. 10 illustrates a further embodiment of the present invention.

In this embodiment, a negative voltage of −1000 V, for example, is applied by a power source 4 to the chuck electrode 33 of the electrostatic chuck 32, as shown in FIG. 10. The timing at which this voltage is applied could be immediately after a film has been formed on the wafer 10 and the wafer 10 has been removed from the mounting stand 3 by the conveyor arm, for example. The transfer of the wafer to the conveyor arm could be done by pushing the wafer upward by projecting pins incorporated within the mounting stand 3, then inserting the arm into the lower-surface side of the wafer.

The thickness of the dielectric member above the chuck electrode 33 is extremely thin, on the order of 0.4 mm, and moreover an ordinary conductive material is mixed into the material such as alumina or aluminum nitride of the dielectric member used in the electrostatic chuck, to ensure that the residual charge is small when the electrostatic chuck is switched of. This means that the surface layer portion of the dielectric member (the portion above the chuck electrode 33) is slightly conductive. There is therefore a voltage drop in this surface layer portion, so the surface of the mounting stand 3 is at a negative potential even when the negative voltage of the power source 4 is not present. Since the particles within the plasma remain negatively charged within a high degree of vacuum, it is difficult for these particles to come close to the surface of the mounting stand 3, and thus the adhesion of such particles to the mounting stand 3 is suppressed. This method can also be applied to etching.

Figure 11:
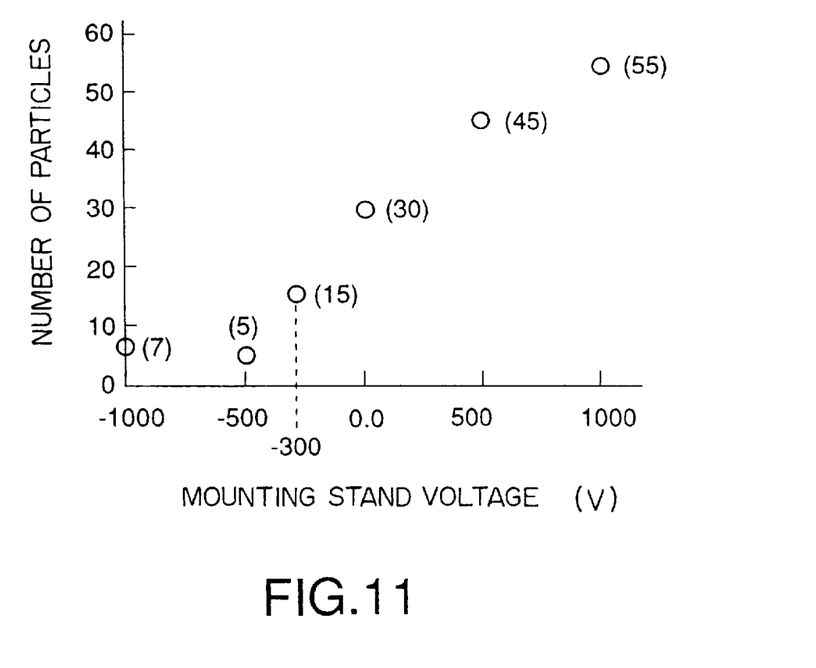
FIG. 11 is a graph of the relationship between the bias voltage applied to the mounting stand after the film has been formed and the number of particles.

Experiments were performed wherein an SiOF film was formed on a wafer under the above described conditions then that wafer was removed from the mounting stand 3 by the conveyor arm, various different voltages were applied to the chuck electrode 33 of the mounting stand 3, the next wafer was then placed on the mounting stand 3, that wafer was removed and placed in a cassette, and the numbers of particles between 0.25 μm and 1 μm that adhered to the surface of the unconveyed wafer immediately therebelow were counted. The results are shown in FIG. 11. It can be seen from these results that the number of particles is reduced by applying a negative voltage to the chuck electrode 33 of the mounting stand 3.

Figure 12:
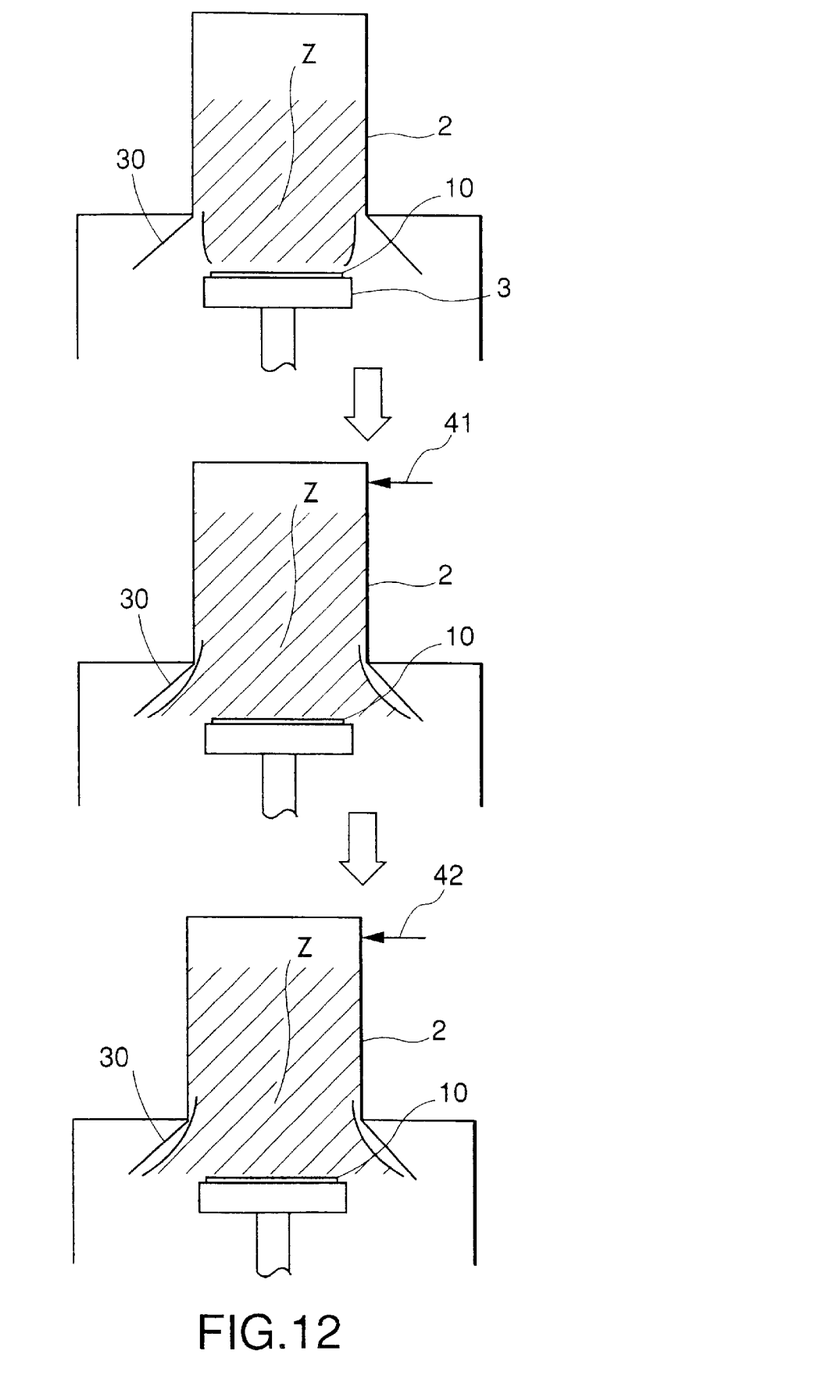
FIG. 12 illustrates a still further embodiment of the present invention.

The description now turns to a further embodiment of the present invention. The configuration of this embodiment is such that, after the film-formation processing, a first cleaning step is performed with a cleaning gas 41 comprising a halogen gas, such as $NF_3$, $CF_4$, or $ClF_3$, then a second cleaning step is performed with a cleaning gas 42 comprising at least $O_2$, such as a mixture of $O_2$ and Ar, as shown in FIG. 12. The cleaning gases 41 and 42 are supplied from the plasma gas nozzles 26 of the apparatus, as shown in FIG. 1. To ensure that a plasma zone Z that is wider than the plasma zone used during the film formation is created for the cleaning steps, a dispersed magnetic field is formed by, for example, reducing the current in the auxiliary electromagnetic coil 28 to less than that during the film formation, or to zero, as previously described with reference to FIG. 6.

Use of this method makes it possible to reduce particles in an apparatus for forming a film of a material such as SiOF, $SiO_2$, or polysilicon. The reason therefor will now be discussed. After films have been formed on a certain number of wafers, such as 13 wafers, the interior of the vacuum vessel 2 is cleaned with a halogen type of gas. However, when the present inventors investigated more closely, they found that some particles will adhere to the next wafer to be processed, albeit a very small number thereof, even after this cleaning, and carbon is comprised within these particles. In other words, they determined that previous fragments remain on surfaces such as the inner walls of the vessel and the side surfaces of the mounting stand 3, even when cleaning is done with a halogen gas.

The inventors considered that this carbon is dispersed from the O-ring used to provide a hermetic seal for the vacuum vessel. This is considered to be because the O-ring is made of a resin and active seeds of the plasma that enter into crevices in the walls will penetrate the O-ring. Therefore, the reaction between carbon and oxygen when subjected to an oxygen plasma will cause fragments to form $CO_2$ and CO and scatter.

If the plasma zone is broadened by a dispersed magnetic field when cleaning is performed, the cleaning gases are projected over all the surfaces of the mounting stand 3 and also all the walls of the vacuum vessel 2. In this case, the dispersed magnetic field could be formed in either the first cleaning step or the second cleaning step, or in both cleaning steps. Note that it is also possible to form the cusped magnetic field described previously with reference to FIG. 8, to broaden the plasma zone.

Figure 13:
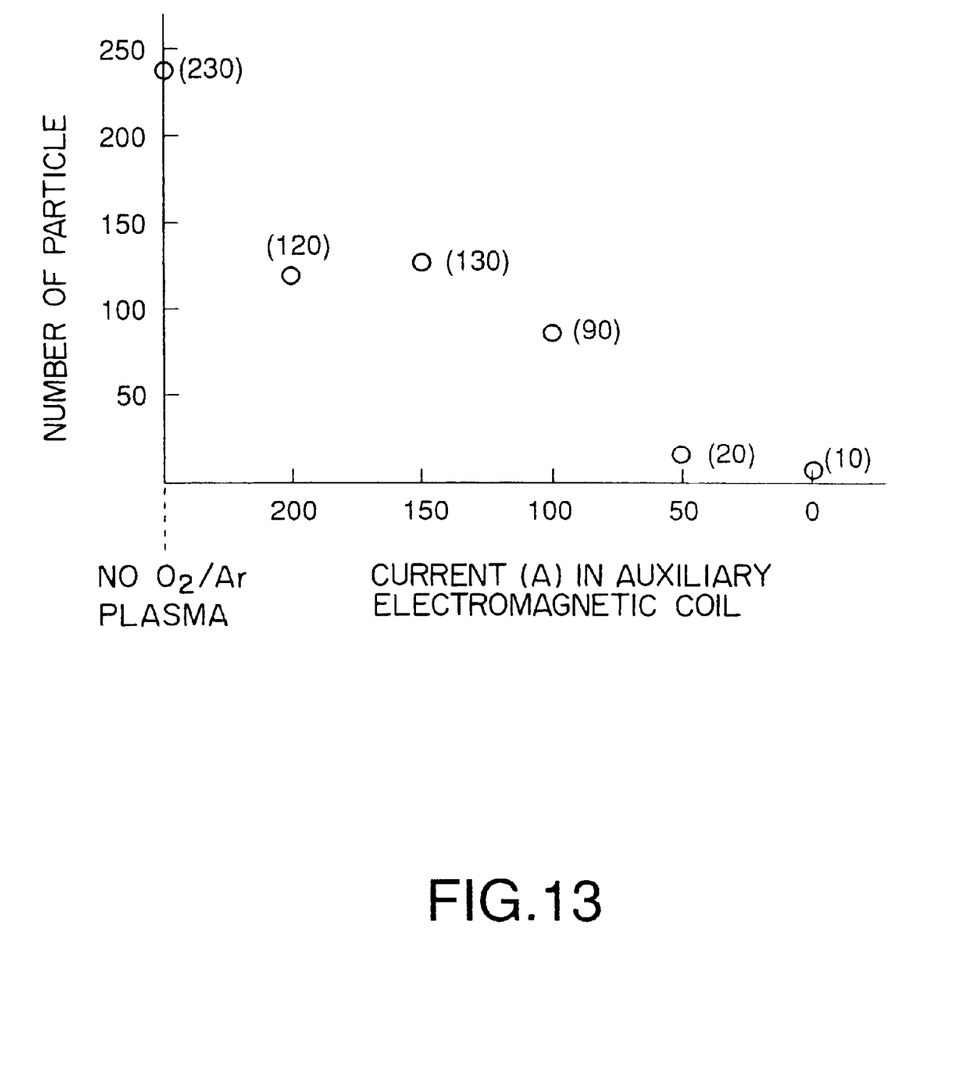
FIG. 13 is a graph of the relationship between the current passing through the auxiliary electromagnetic coil and the number of particles.

Experiments were performed by forming a film of SiOF on each of 13 wafers then executing the first and second cleaning steps, and subsequently forming a film of SiOF on a further wafer. The numbers of particles between 0.25 μm and 1 μm on the surface of that wafer were counted, with the results being as shown in FIG. 13 which shows the relationship between different currents in the auxiliary electromagnetic coil 28 during the second cleaning step and the numbers of particles.

It should be noted that $NF_3$ gas was supplied at 1000 sccm during the first cleaning step, the pressure was 500 Pa, the microwave power was 1200 W, the biasing power was zero, the current in the auxiliary electromagnetic coil 28 was 200 A, and cleaning was performed for ten minutes. During the second cleaning step, $O_2$ and Ar were supplied at 200 sccm and 300 sccm, respectively, the pressure was 0.3 Pa, the microwave power was 1700 W, the biasing power was zero, and the cleaning was performed for one minute.

As a result, it was shown that performing the second cleaning step made it possible to reduce the particles, and broadening the magnetic field made it possible to reduce them even farther.

Thus the present invention makes it possible to suppress contamination of an object to be processed by particles, and also enables an improvement in the yield.

What is claimed is:

1. A plasma processing method comprising the steps of:
   supplying at least electrical power to a processing gas within a processing chamber to form a plasma, and using said plasma to perform a plasma process on an object to be processed;
   subsequently forming a plasma that does not promote processing at an electrical power that is lower than that used during said previous step, instead of said plasma of said processing gas, to form a sheath zone above said object to be processed that is thicker than a sheath zone thereabove during said previous step; and
   conveying said object to be processed out of said processing chamber.

2. A plasma processing method comprising the steps of:
   placing an object to be processed on a mounting stand that is provided within a processing chamber and includes an electrode, supplying at least electrical power to a processing gas to form a plasma, applying biasing power to said electrode, and using said plasma to perform a plasma process on said object to be processed while ions within said plasma are drawn towards said object to be processed;
   subsequently forming a plasma that does not promote processing instead of said plasma of said processing gas, and increasing said biasing power to higher than that used during said previous step, to form a sheath zone above said object to be processed that is thicker than a sheath zone thereabove during said previous step; and
   conveying said object to be processed out of said processing chamber.

3. A plasma processing method comprising the steps of:
   forming a magnetic field by a magnetic field formation means in such a manner that magnetic lines of force thereof run from a zone corresponding to a surface to be processed of an object to be processed towards said object to be processed, and also forming a plasma from a processing gas that is supplied into a processing chamber, based on the interaction between an electrical field and said magnetic field, and using said plasma to perform a plasma process on said object to be processed;
   subsequently forming a plasma that does not promote processing instead of said plasma of said processing gas, and adjusting said magnetic field in such a manner that said magnetic lines of force thereof in the vicinity of said object to be processed fan out further than during said previous step; and
   conveying said object to be processed out of said processing chamber.

4. The plasma processing method as defined in claim 3, wherein:
   said magnetic field formation means is disposed so as to surround a central axis of said object to be processed and comprises a first coil provided above said object to be processed and a second coil provided either beside or below said object to be processed; and
   said step of adjusting said magnetic field is done by either reducing a current flowing through said second coil to less than that during said plasma processing (including a reduction to zero) or reversing said current.

5. A plasma processing method comprising the steps of:
   attracting an object to be processed by electrostatic attraction to a mounting stand that is provided within a processing chamber and that includes an electrostatic chuck, and also supplying electrical power to a processing gas within a processing chamber to form a plasma, then using said plasma to perform a plasma process on said object to be processed;
   subsequently separating said object to be processed from said mounting stand;
   subsequently applying a negative voltage to a chuck electrode of said electrostatic chuck; and
   placing another object to be processed on said mounting stand and performing plasma processing thereon.

* * * * *